United States Patent
Schreffler

(10) Patent No.: US 6,400,570 B2
(45) Date of Patent: *Jun. 4, 2002

(54) PLATED THROUGH-HOLES FOR SIGNAL INTERCONNECTIONS IN AN ELECTRONIC COMPONENT ASSEMBLY

(75) Inventor: Gary J. Schreffler, Winter Park, FL (US)

(73) Assignee: Lockheed Martin Corporation, Bethesda, MD (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/393,889

(22) Filed: Sep. 10, 1999

(51) Int. Cl.[7] ................................................ H05K 7/20
(52) U.S. Cl. ...................... 361/704; 361/702; 361/707; 257/707; 165/80.3; 174/16.3
(58) Field of Search ................................. 361/700–707, 361/710–712, 715–725, 688, 816, 813, 806, 820, 684; 257/703–705, 706–727, 795, 747, 659, 700, 738, 664; 165/80.2, 80.3, 80.4, 46, 185; 428/650, 195, 621, 614, 185, 285, 406–408, 457, 901, 902; 29/25.42, 650, 195, 197, 137, 843; 174/52.4, 252, 35 MS, 254, 16.3, 62.8

(56) References Cited

U.S. PATENT DOCUMENTS

| | | | |
|---|---|---|---|
| 3,628,999 A | | 12/1971 | Schneble, Jr. et al. |
| 3,660,726 A | | 5/1972 | Ammon |
| 3,739,469 A | | 6/1973 | Dougherty |
| 3,750,278 A | | 8/1973 | Baker et al. |
| 3,867,759 A | | 2/1975 | Siefker |
| 3,873,756 A | * | 3/1975 | Gall et al. .................. 174/68.5 |
| 3,932,932 A | * | 1/1976 | Goodman .................... 29/625 |
| 3,934,334 A | * | 1/1976 | Hanni ......................... 29/625 |
| 3,934,335 A | | 1/1976 | Nelson |
| 4,478,884 A | * | 10/1984 | Burness et al. ................ 427/97 |
| 4,633,035 A | | 12/1986 | McMonagle |
| 4,791,248 A | * | 12/1988 | Oldenettel .................. 174/68.5 |
| 4,803,450 A | * | 2/1989 | Burgess et al. ............. 333/238 |
| 4,804,575 A | * | 2/1989 | Kohm ......................... 428/209 |
| 4,878,152 A | * | 10/1989 | Sauzade et al. ............. 361/386 |
| 4,882,454 A | * | 11/1989 | Peterson et al. ........... 174/68.5 |
| 4,963,697 A | * | 10/1990 | Peterson et al. ............. 174/252 |
| 5,065,227 A | * | 11/1991 | Frankeny et al. ............. 357/74 |
| 5,195,021 A | * | 3/1993 | Ozmat et al. ............... 361/386 |
| 5,316,787 A | * | 5/1994 | Frankeny et al. ............. 427/97 |
| 5,366,027 A | | 11/1994 | Turek et al. |
| 5,397,917 A | * | 3/1995 | Ommen et al. ............. 257/698 |
| 5,562,971 A | | 10/1996 | Tsuru et al. |
| 5,662,987 A | | 9/1997 | Mizumoto et al. |
| 6,011,691 A | * | 1/2000 | Schreffler .................... 361/704 |
| 6,046,410 A | * | 4/2000 | Wojnarowski et al. ....... 174/262 |
| 6,078,359 A | * | 6/2000 | Conder ........................ 348/374 |

\* cited by examiner

*Primary Examiner*—Darren Schuberg
*Assistant Examiner*—Michael Datskovsky
(74) *Attorney, Agent, or Firm*—Burns, Doane, Swecker & Mathis, LLP

(57) ABSTRACT

The present invention is directed to an electronic component assembly and method of manufacture which can be efficiently implemented and which reduces the amount of work required to create a plated through-hole for connecting one circuit to another circuit in an electronic component assembly. During electronic component assembly fabrication, at least a portion of an inner core of the electronic component assembly's heat sink assembly is replaced with a dielectric "zone." Once the electronic component assembly is manufactured, connections from one circuit on one side of the electronic component assembly to another circuit on the other side of the electronic component assembly can be achieved using plated through-holes. As such, circuit boards can be connected on opposite sides of the electronic component assembly without having to perform the labor intensive connection of circuits through the use of discrete wires or printed flexes.

19 Claims, 3 Drawing Sheets

PLATED THROUGH-HOLES FOR SIGNAL INTERCONNECTIONS IN AN ELECTRONIC COMPONENT ASSEMBLY

BACKGROUND OF THE INVENTION

1. Field of the Invention

The present invention generally relates to plated through-holes for an electronic component assembly and to an associated method for making the through-holes which eliminates the need to use discrete wires and printed flexes as connectors between circuits on the electronic component assembly.

2. State of the Art

A circuit element situated on one printed wiring board located on one side of an electronic component assembly is, at times, required to be connected to another circuit element located on another printed wiring board located on the opposite side of the electronic circuit assembly. Connections can be run from one side of the electronic component assembly to the other through the use of discrete wires or printed flexes which are connected to the circuit elements. This is done after the electronic component assembly has been assembled or after each component is attached to the printed wiring boards. As a result, however, more production time is required to connect the discrete wires and printed flexes between wiring boards on opposite sides of an electronic component assembly. Furthermore, the use of discrete wires and printed flexes after the manufacturing of the electronic component assembly requires a high degree of precision labor which is more expensive and has a higher incidence of errors occurring during manufacture.

The use of through-holes has been employed to provide communication from one layer of a printed wiring board of an electronic component assembly to another layer. For example, U.S. Pat. No. 3,739,469 (Dougherty, Jr.) describes a method for fabricating multi-layer circuit boards with vias in the internal layers that are concentric with plated through-holes. However, the internal vias are "plugged" with a dielectric pre-peg used during a lamination phase of the fabrication process. That is, excess dielectric material which is a by-product of the lamination process can result in an insufficient amount dielectric material filling the through-hole. This can result in improper plating of the through-hole and incorrect circuit operation.

In addition, due to the internal structure of electronic component assemblies, properly placing through holes is difficult. Heat sinks located at the core of the electronic component assembly present problems when forming the through holes.

U.S. Pat. No. 5,562,971 (Tsuru et al.) discloses the placement of through-holes in a multi-layer printing board. The through holes are drilled after the formation of the circuit board and insulating layers are laminated by heating under pressure. A conductive layer is then placed over the drilled hole. In this case, there is no heat sink at the core of the electronic component assembly.

Electrical circuits contained in the printed wiring boards have a common "circuit ground potential" while the chassis, to which electronic component assemblies are connected, includes a separate "chassis ground potential" . The separate ground circuits are maintained to avoid electrical problems. For example, if the different ground elements of the circuit and the chassis, to which an electronic component assembly is connected, are brought into contact, a ground loop can form between the printed wiring boards which raises the potential of the circuit ground above zero volts and renders the electrical circuits susceptible to noise. The proper operation of circuits which use discrete logic levels can be affected when noise distorts the circuit ground to a value greater than zero volts.

Known methods of connecting one printed wiring board to another through the use of connectors are labor intensive and require a high degree of precision to avoid short circuits. Accordingly, an efficient, cost-effective technique to run a connection from one side of an electronic component assembly to the other is needed.

SUMMARY OF THE INVENTION

The present invention is directed to an electronic component assembly and an allocated method of manufacture which can be efficiently implemented and which reduces the amount of work required to create a plated through-hole for connecting one circuit to another circuit in an electronic component assembly. Exemplary embodiments ensure that during electronic component assembly fabrication, at least a portion of an inner core of the electronic component assembly's heat sink assembly is replaced with a dielectric "zone." When the electronic component assembly is manufactured, connections from one circuit on one side of the electronic component assembly to another circuit on the other side of the electronic component assembly are achieved using plated through-holes. As such, circuit boards can be electrically connected on opposite sides of the electronic component assembly without having to perform the labor intensive connection of circuits through the use of discrete wires or printed flexes. The plated through holes are made through dielectric zones selectively placed into the inner core of the electronic component assembly.

Generally speaking, exemplary embodiments relate to an electronic component assembly which comprises at least first and second electrical circuits and a heat sink assembly connected to the first and second electrical circuits, the heat sink assembly including an inner core having at least a first portion made of a dielectric material having a through-hole from the first electrical circuit to the second electrical circuit, and a second portion made of a material that is different from the dielectric material, wherein the first portion is one of co-cured and bonded with the second portion.

In another exemplary embodiment of the present invention, a method for producing a heat sink assembly is disclosed which comprises the steps of: providing an inner core made of a heat sink material, forming a segment of the heat sink material with a first dielectric segment wherein a through-hole is to be established from a first electrical circuit to a second electrical circuit, placing a second dielectric around the inner core, selectively plating the second dielectric with a first electrically conductive foil and plating a conductive material on the first electrically conductive foil, placing first and second electrical circuits on the second dielectric and on opposite sides of the inner core, and making a through hole from the first electrical circuit through the first dielectric segment of the inner core to the second electrical circuit.

BRIEF DESCRIPTION OF THE DRAWINGS

Other objects and advantages of the present invention will become more apparent from the following detailed description of preferred embodiments, when read in conjunction with the accompanying drawings wherein like elements have been represented by like reference numerals and wherein.

DETAILED DESCRIPTION OF THE PREFERRED EMBODIMENTS

Figure 1:
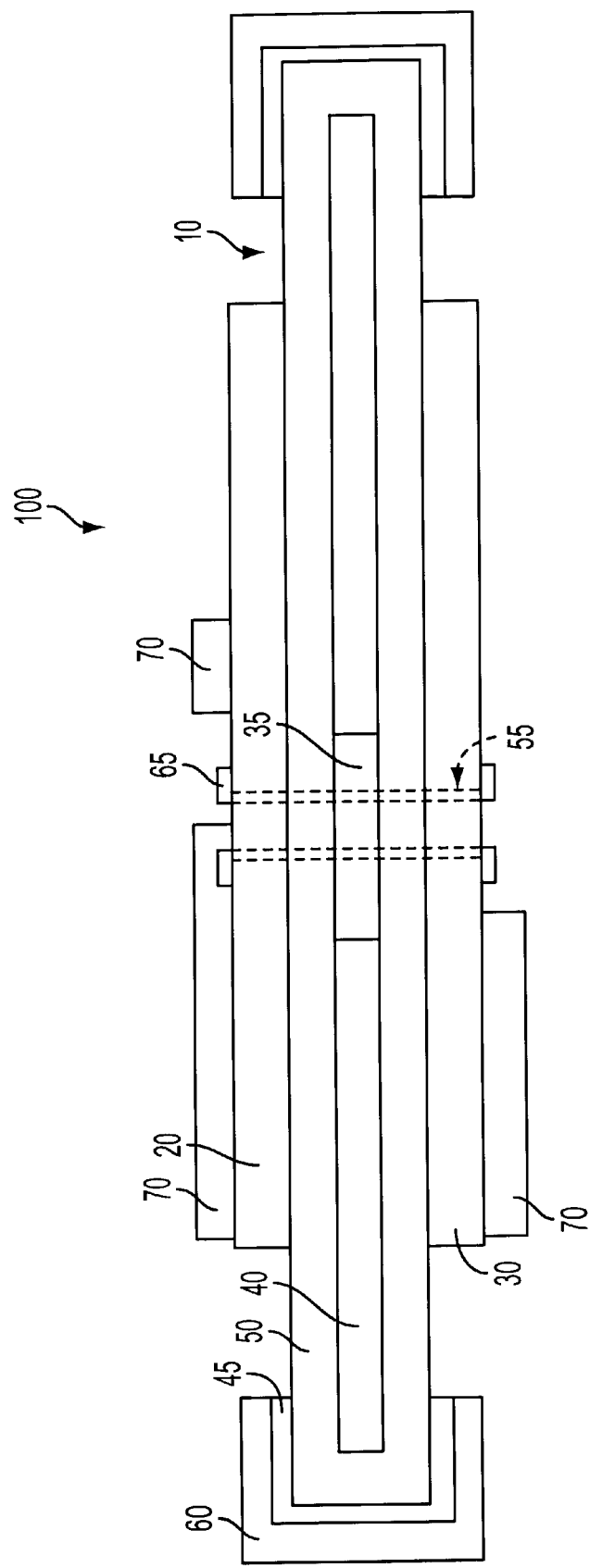
FIG. 1 shows a cross-sectional view of an exemplary embodiment of an electronic component assembly of the present invention, with printed wiring boards being located on both sides of a heat sink assembly.

FIG. 1 shows a cross-sectional view of an electronic component assembly 100, wherein a heat sink assembly 10 is located between two printed wiring boards (PWBs) 20 and 30. One or both of the printed wiring boards 20 or 30 can have one or more circuit elements 70 located on each board. At the center of the heat sink assembly 10 is an inner core 40 composed of a graphite material surrounded by a dielectric layer 50.

The graphite material is chosen based upon several different factors such as thermal conductivity and electrical conductivity. The graphite material of the FIG. 1 exemplary embodiment has sufficient electrical and thermal conductivity to achieve a desired heat sink function, given the heat dissipation of electrical circuits included on the printed wiring boards. Plural sheets of graphite can be combined with a filler resin and pressed to become a composite laminate. An example of a common graphite material used to make the composite laminate is Thermalgraph™, available from Amoco Corporation. Other types of common graphite fiber and filler resins can also be used as the inner core 40 of the heat sink assembly, as can any other thermally conductive material.

In accordance with an exemplary embodiment of the present invention, during the fabrication process, to accommodate plated through-holes used to interconnect plural printed wiring boards, one or more dielectric zones 35 can be imbedded within the graphite material of FIG. 1. The dielectric zones 35 can be placed within the graphite laminate and co-cured with the laminate or bonded to the graphite material after it has been cured.

Figure 2:
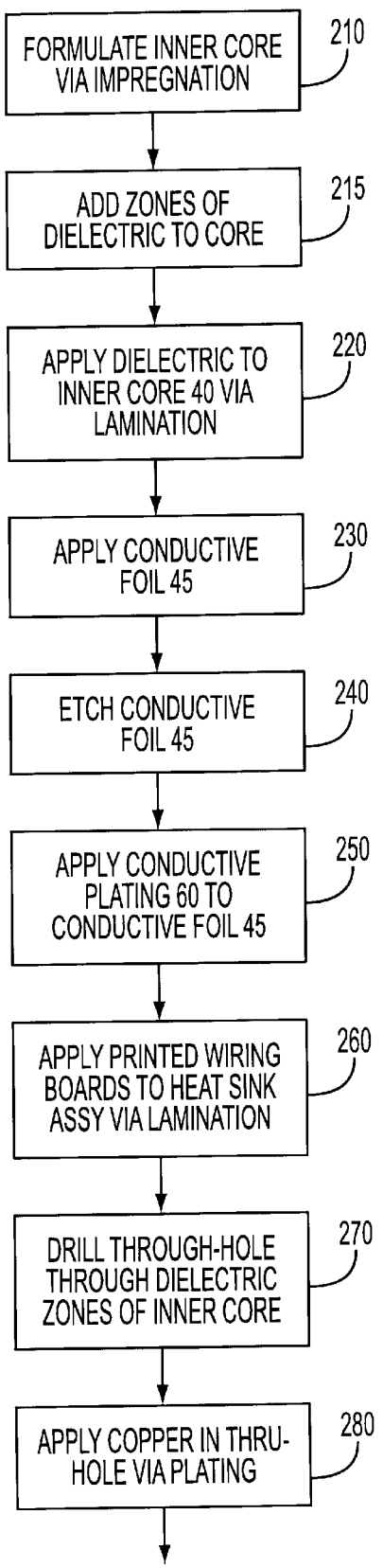
FIG. 2 shows a flow chart of an exemplary process for making an electronic component assembly in accordance with the present invention.

FIG. 2 illustrates a flow chart which depicts an exemplary process by which the electronic component assembly 100 in FIG. 1 can be produced. In step 210 of the FIG. 2 process, the electronic component assembly includes a heat sink assembly 10 on which electrical circuits are placed. The heat sink assembly 10 further includes an inner core having 40 at least a first portion made of a dielectric material. The inner core 40 of the heat sink assembly can comprise of sheets of graphite cut into desired shapes. After a heat sink material and resin have been selected, the inner core 40 of the FIG. 1 heat sink assembly is formed via impregnation. To form the inner core 40 by impregnation, resin is added to the graphite material, such as layered graphite cloth. The graphite cloth and resin are then pressed to formulate the inner core 40 of the heat sink assembly 10.

In step 215 of the FIG. 2 flow chart, to account for a plated through-hole, one or more of the FIG. 1 dielectric zones 35 can be embedded within the graphite material. The dielectric zones 35 can, like the heat sink assembly, be cut from sheets of dielectric materials. The dielectric material can be chosen based upon factors such as electrical conductivity, thermal conductivity and ability of the material to be plated by other conductive materials. For the dielectric material of the zones 35 of this exemplary embodiment, a material which is substantially electrically non-conductive, and which has good thermal conductivity can be chosen. The dielectric zones 35 can be a printing wiring board laminate, such as a cyanate ester laminate, an epoxy glass, kevlar, polyamide, quartz or any other suitable material. The graphite material of the inner core is then co-cured with the dielectric zones 35, or bonded to previously cured dielectric zone(s) 35.

In step 220, after the inner core 40 of FIG. 1 has been made via impregnation or lamination, a next layer of the heat sink assembly is applied as a dielectric layer 50 which surrounds the inner core 40. For example, the dielectric layer 50 can be chosen based on the same factors used to choose the dielectric zones 35. In addition to being substantially electrically non-conductive and thermally conductive, it is also advantageous for the dielectric material chosen to be easily plateable with material used for electrically contacting the chassis ground. For example, the dielectric material 50 can be plated with a nickel material over a copper layer (e.g., nickel over copper).

Also, the dielectric material for both the dielectric zones 35 and the dielectric layer 50 can be selected in accordance with a temperature value, $T_g$, which is the temperature at which the material changes physical properties by becoming soft or liquefying. The dielectric material's $T_g$ value can be selected high enough that the material does not melt or become soft during lamination processing when the electronic component assembly is being formed. For example, where a dielectric material has a relatively low $T_g$ value, higher temperatures (i.e., temperatures above the $T_g$ value) cause a change in material property that results in a softening of the dielectric layer 50 or delamination of the dielectric material 50 down to the inner core 40. The dielectric material 50 is applied to the surface of the inner core 40 by, for example, lamination, or any other suitable technique, such as any coating technique. The dielectric material 50 can be applied through a coating technique to avoid bonding of a conductive foil to the dielectric laminate. The $T_g$ value of dielectric materials which are applied through coating are typically lower than dielectric materials that are applied through lamination. Alternately, the dielectric layer 50 can be formed during formation of the inner core 40 via the impregnation. For example, sheets of dielectric material can be placed on top of the graphite cloth subsequent to embedding the dielectric zones 35. Then resin can be added and the assembly pressed to produce a composite impregnated inner core 40 having dielectric zones 35 and dielectric layer 50.

In step 230, after the FIG. 1 dielectric material 50 shown in FIG. 1 has been formed, a conductive foil 45 of FIG. 1, such as copper, can be bonded to the dielectric material 50 and subsequently plated (e.g., with copper) to cover the edges of dielectric layer 50.

In step 240, portions of the FIG. 1 conductive foil 45 can be selectively removed through patterning and etching. For example, photoresist can be deposited over the conductive foil and selectively patterned to remain over areas where the foil is to be retained, using known photolithography techniques. The heat sink assembly 10 is irradiated with light and the conductive foil 45 is removed, via chemical etching, in any areas where the photoresist was not exposed to the light. In an exemplary embodiment, the foil 45 can be retained around the edges of the heat sink assembly as shown in FIG. 1.

In step 250 of FIG. 2, a layer of the FIG. 1 conductive material 60 (e.g., nickel, gold) is plated onto the heat sink assembly 10 which now includes the patterned foil 45. The type of conductive material 60 is chosen based upon, for example, the electrical conductivity, corrosion resistance, durability and/or the ability to adhere to the foil. The conductive material 60 is placed on top of the patterned foil formed in steps 230 and 240 of FIG. 2. Depending on the manner in which plating is performed (e.g., electroplating), the conductive material 60 can adhere to conductive foil and not to the dielectric material of the heat sink assembly.

In step 260 of FIG. 2, the FIG. 1 printed wiring boards 20 and 30 are placed onto the heat sink assembly through another lamination process. The conductive material 60 applied in step 250 and the conductive foil 45 applied in step 230 are, in an exemplary embodiment, prevented from directly contacting conductive areas of the printed wiring boards or the inner core of the heat sink assembly by any desired spacing.

In step 270, one or more through-holes 55 of FIG. 1 are drilled after the printed wiring boards 20 and 30 have been attached to the assembly through lamination. When the one or more through-holes are drilled, the drill penetrates through a dielectric zone 35 of the inner core 40. Each hole is drilled from a printed wiring board on one side of assembly 100, through a dielectric zone 35, to a printed wiring board on another side of the assembly 100.

In step 280, another layer of conductive plating 65 (e.g., copper, nickel, gold, rhodium or other suitable material) can be applied to the surface of the printed wiring boards 20 and 30 and through-holes 55 to establish a circuit ground within the electronic component assembly 100. The conductive foil 65 can then be selectively removed for placement of individual components, such as circuit components 70, on the printed wiring board in accordance with known methodology.

The drilling of a through-hole 55 allows for a connection between the two printed wiring boards 20 and 30. Provided there is no connection with the chassis ground, there will be no shorts and, as a result, the electronic component assembly 100 can efficiently operate.

Figure 3:
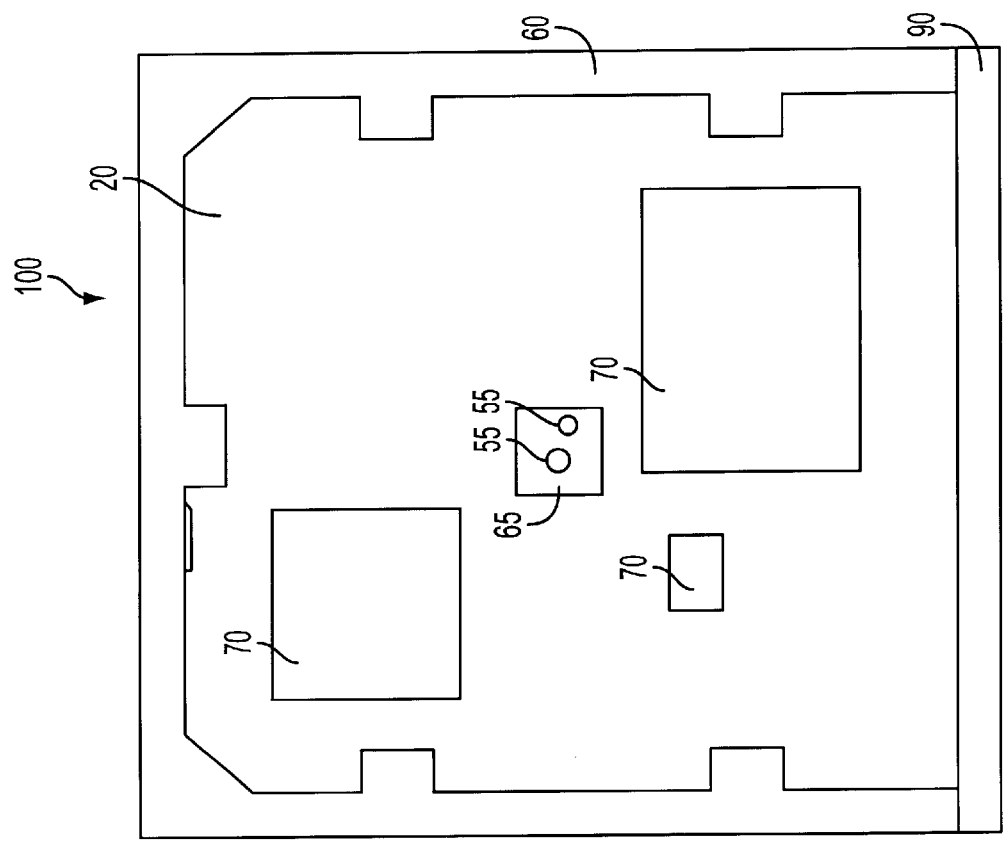
FIG. 3 shows a top view of an exemplary embodiment of an electronic component assembly in accordance with the present invention.

FIG. 3 shows a top view of the electronic component assembly. As shown in FIG. 3, the conductive material 60 surrounds the periphery of the electronic component assembly 100. A connector 90 is attached to a lower part of the electric component assembly 100. The shell of the connector 90 is chassis ground. The circuit elements 70 and plated through-hole(s) 55 of the printed wiring board 20 are maintained at circuit connection.

It will be appreciated by those skilled in the art that the present invention can be embodied in other specific forms without departing from the spirit or essential characteristics thereof. The presently disclosed embodiments are therefore considered in all respects illustrative and not restricted. The scope of the invention is indicated by the appended claims rather than the foregoing description and all changes that come within the meaning and range and equivalence thereof are intended to be embraced within.

What is claimed is:

1. An electronic component assembly comprising:
   at least first and second electrical circuits; and
   a heat sink assembly connected to said first and second electrical circuits, said heat sink assembly including an inner core having at least a first portion made of a dielectric material having multiple through-holes from said first electrical circuit to said second electrical circuit, and a second portion surrounding said first portion and made of a material that is different from said dielectric material, wherein the first portion is co-cured with said second portion.

2. The electric component assembly of claim 1, wherein the second portion material is made of graphite composite.

3. The electronic component assembly of claim 1 wherein the dielectric material has a selected temperature value $T_g$ at which the dielectric material changes properties.

4. The electronic component assembly of claim 3, wherein the dielectric material is selected from the group consisting of:
   cyanate ester, epoxy glasses, kevlar, polyamide and quartz.

5. A heat sink assembly comprising:
   a conductive inner core, wherein said conductive inner core has at least a portion which is a first dielectric for establishing multiple through-holes from one electrical circuit to a second electrical circuit, wherein said first dielectric surrounds the through-hole and is co-cured with a remainder of said inner core; and
   a second dielectric placed at least in part on said conductive inner core.

6. The heat sink assembly of claim 5, wherein a dielectric material of said second dielectric is selected based upon a temperature at which said dielectric material changes physical properties.

7. The heat sink assembly of claim 5, comprising:
   a first conductive layer at a ground potential selectively placed on said second dielectric.

8. The heat sink assembly of claim 7, further comprising;
   a second conductive layer at said ground potential placed on said first conductive layer.

9. A method for producing a heat sink assembly comprising the steps of:
   providing an inner core made of a heat sink material;
   forming a segment of said heat sink material with a first dielectric segment wherein at least one through-hole is to be established from a first electrical circuit to a second electrical circuit, wherein the inner core and the first dielectric segment are co-cured to form a single laminate structure;
   placing a second dielectric around said inner core;
   selectively plating said second dielectric with a first electrically conductive foil and plating a conductive material on the first electrically conductive foil;
   placing first and second electrical circuits on the second dielectric and on opposite sides of said inner core; and
   making at least one through hole from said first electrical circuit through the first dielectric segment of said inner core to the second electrical circuit.

10. The method of claim 9, comprising:
    plating said at least one through hole with a second electrically conductive foil.

11. The method of claim 9, wherein said heat sink material has an electrical conductivity and a thermal conductivity selected based on a heat dissipation of the first electrical circuit and the second electrical circuit.

12. The method of claim 11, wherein said heat sink material is made of graphite composite.

13. The method of claim 9, wherein said first dielectric segment and said second dielectric are each substantially electrically non-conductive.

14. The method of claim 9, wherein said first dielectric segment and said second dielectric material layer are selected from the group consisting of:
    cyanate ester, epoxy glasses, kevlar, polyamide and quartz.

15. The heat sink assembly of claim 5, wherein said remainder of said inner core has an thermal conductivity and an electrical conductivity selected based on a heat dissipation from said one electrical circuit and said second electrical circuit.

16. The electronic component assembly of claim 1, wherein the heat sink assembly comprises:

a dielectric layer surrounding the inner core.

17. The heat sink assembly of claim 5, wherein the second dielectric surrounds the conductive inner core.

18. The method of claim 9, wherein said second dielectric surrounds said inner core.

19. The method of claim 9, wherein said first dielectric segment and said second dielectric each have a temperature value $T_g$ at which their physical properties change.

* * * * *